(12) United States Patent
Xue et al.

(10) Patent No.: US 11,804,497 B2
(45) Date of Patent: Oct. 31, 2023

(54) GOA CIRCUIT, DISPLAY PANEL, AND REPAIR METHOD

(71) Applicant: Shenzhen China Star Optoelectronics Semiconductor Display Technology Co., Ltd., Guangdong (CN)

(72) Inventors: Yan Xue, Guangdong (CN); Shuai Zhou, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 592 days.

(21) Appl. No.: 16/969,203

(22) PCT Filed: May 14, 2020

(86) PCT No.: PCT/CN2020/090299
§ 371 (c)(1),
(2) Date: Aug. 12, 2020

(87) PCT Pub. No.: WO2021/203520
PCT Pub. Date: Oct. 14, 2021

(65) Prior Publication Data
US 2023/0144117 A1    May 11, 2023

(30) Foreign Application Priority Data
Apr. 7, 2020 (CN) .......................... 202010263732.5

(51) Int. Cl.
*H01L 27/12* (2006.01)
*G09G 3/20* (2006.01)
(Continued)

(52) U.S. Cl.
CPC ........... *H01L 27/1259* (2013.01); *G09G 3/20* (2013.01); *H01L 27/124* (2013.01);
(Continued)

(58) Field of Classification Search
CPC ..... H01L 27/1259; H01L 27/124; G09G 3/20; G09G 2300/0408
See application file for complete search history.

(56) References Cited

U.S. PATENT DOCUMENTS 10,644,120 B2 * 5/2020 He .......................... H01L 27/124
10,902,932 B2 * 1/2021 Feng ................... H01L 27/1262
(Continued)

FOREIGN PATENT DOCUMENTS

| CN | 102798999 | 11/2012 |
|---|---|---|
| CN | 103680388 | 3/2014 |

(Continued)

*Primary Examiner* — Vinh T Lam

(57) ABSTRACT

A gate driver on array (GOA) circuit, a display panel, and a repair method are provided. Connecting lines connecting GOA units, and grid lines disposed corresponding to disposed positions of the connecting lines albeit in a different layer from the connecting lines are included. When a short circuit or open circuit occurs in the connecting lines, by adopting one or more of methods: melting and disconnecting a part of the grid lines near a malfunction, melting and disconnecting a part of the connecting lines near the malfunction, or welding together the part of the grid lines and the part of the connecting lines, it is possible to repair the circuit by repairing or replacing the part of the connecting lines.

12 Claims, 6 Drawing Sheets

(52) U.S. Cl.
CPC ............ *G09G 2300/0408* (2013.01); *G09G 2300/0426* (2013.01); *G09G 2310/0267* (2013.01); *G09G 2330/08* (2013.01)

(56) References Cited

U.S. PATENT DOCUMENTS

| | | | |
|---|---|---|---|
| 11,404,007 B2* | 8/2022 | Zeng | G09G 3/3677 |
| 2007/0171346 A1 | 7/2007 | Chang et al. | |
| 2016/0202538 A1 | 7/2016 | Lee et al. | |
| 2018/0301103 A1* | 10/2018 | Li | G02F 1/136259 |
| 2019/0164855 A1* | 5/2019 | Hong | H01L 21/76892 |
| 2021/0358416 A1* | 11/2021 | Xue | G09G 3/3266 |

FOREIGN PATENT DOCUMENTS

| | | | |
|---|---|---|---|
| CN | 103984174 | 8/2014 | |
| CN | 106409149 | 2/2017 | |
| CN | 107862998 | 3/2018 | |
| CN | 108806511 | 11/2018 | |
| CN | 108962162 A * | 12/2018 | ........... G06F 3/0412 |
| CN | 106548758 B * | 2/2019 | ........... G09G 3/3677 |
| CN | 107958656 B * | 7/2019 | ........... G09G 3/3677 |
| CN | 111081148 | 4/2020 | |
| WO | WO-2015096246 A1 * | 7/2015 | ............. G02F 1/133 |

\* cited by examiner

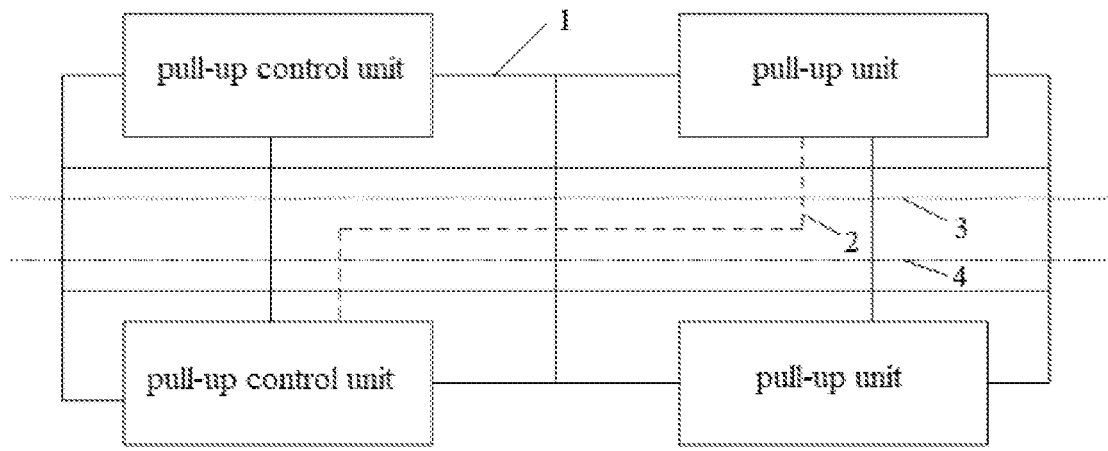

FIG. 1

Providing grid lines disposed in a different layer from connecting lines, wherein the grid lines correspond to disposed positions of the connecting lines.   S1

Adopting one or more of three methods of melting and disconnecting a part of the grid lines near a short circuit or an open circuit, melting and disconnecting a part of the connecting lines near the short circuit or open circuit, or welding together the part of the grid lines and the part of the connecting lines, to repair the connecting lines and a GOA circuit if a short circuit or open circuit malfunction occurs at the connecting lines.   S2

FIG. 2

GOA CIRCUIT, DISPLAY PANEL, AND REPAIR METHOD

RELATED APPLICATIONS

This application is a National Phase of PCT Patent Application No. PCT/CN2020/090299 having International filing date of May 14, 2020, which claims the benefit of priority of Chinese Patent Application No. 202010263732.5 filed on Apr. 7, 2020. The contents of the above applications are all incorporated by reference as if fully set forth herein in their entirety.

FIELD AND BACKGROUND OF THE INVENTION

The present application relates to the field of display technology, and especially to a gate driver on array (GOA) circuit, a display panel, and a repair method.

A gate driver on array (GOA) circuit is a circuit that realizes a row-by-row scan of a panel. Because using a GOA circuit can directly integrate a gate driving circuit on an array substrate of a display panel and does not need an externally connected silicon chip as a driving chip, the display panel becomes more integrated and manufacturing processes are simplified, so that production cost can be decreased and module yields can be increased. The GOA circuit approach is now widely applied in a new generation of display panels that pursues lightweight-ness, thinness, narrow borders, and a variety of forms. However, a structure of the GOA circuit is complicated and with more internal connecting lines (solid lines, dotted lines, and dashed lines in FIG. 1), internal malfunctions such as open circuits caused by electrostatic discharge (i.e. electrostatic breakdown) or a short circuit caused by deficient manufacturing processes easily occurs. If short circuit or open circuit malfunctions occur in important internal wirings, such as cascade lines, feedback signal lines, clock signal CK lines, constant high voltage VGH lines, constant low voltage VGL lines, etc., then electric properties of thin film transistors (TFT) in the GOA circuit will be lost and fail, and therefore causing the entire GOA circuit to fail.

SUMMARY OF THE INVENTION

The present application provides a GOA circuit, a display panel, and a repair method to resolve a technical problem that currently, repair of a GOA circuit is mainly directed to repair of modules or devices of a GOA unit therein, and repair methods of wirings in the GOA circuit is less; furthermore, because it generally needs to add masking processes to realize repair of the wirings in the GOA circuit, when a short circuit or open circuit malfunction occurs in important internal wirings, repair of the GOA circuit is often complicated and inconvenient.

As a first aspect, embodiments of the present application provides a repair method of a GOA circuit, the GOA circuit includes at least two cascaded GOA units and connecting lines connected to the cascaded GOA units, and the repair method of the GOA circuit includes: providing grid lines disposed in a different layer from the connecting lines, wherein the grid lines correspond to disposed positions of the connecting lines; and if a short circuit or open circuit malfunction occurs in the connecting lines, adopting one or more of three methods of melting and disconnecting a part of the grid lines near a short circuit or open circuit, melting and disconnecting a part of the connecting lines near the short circuit or open circuit, or welding together the part of the grid lines and the part of the connecting lines, to repair the connecting lines and the GOA circuit.

In some embodiments, the repair method of the GOA circuit includes if a short circuit malfunction occurs between the connecting lines and the grid lines, melting and disconnecting a part of the grid lines near a short circuit between the connecting lines and the grid lines to repair the connecting lines.

In some embodiments, the repair method of the GOA circuit includes if the short circuit or open circuit malfunction occurs in the connecting lines, melting and disconnecting the part of the connecting lines near the short circuit or open circuit and a part of the grid lines, and welding together the part of the grid lines and the part of the connecting lines, to form a bridge line consisting of the part of the grid lines that is configured to replace the part of the connecting lines.

In some embodiments, the connecting lines include cascade lines and signal lines, the cascade lines are configured to connect two cascaded GOA units, the signal lines are connected to the GOA units, and the repair method of the GOA circuit includes: if the short circuit or open circuit malfunction occurs between the cascade lines and the signal lines, melting and disconnecting a first part of the grid lines, a second part of the grid lines, a part of the cascade lines, and a part of the signal lines near a short circuit or open circuit between the cascade lines and the signal lines, and welding together the first part of the grid lines and the part of the cascade lines, to form a first bridge line consisting of the first part of the grid lines that is configured to replace the part of the cascade line, while welding together the second part of the grid lines and the part of the signal lines, to form a second bridge line consisting of the second part of the grid lines that is configured to replace the part of the signal lines.

In some embodiments, the connecting lines include the cascade lines and the signal lines, each stage of the GOA units includes a pull-up unit and a pull-up control unit connected to each other, and the pull-up unit of an N stage GOA unit is connected to the pull-up control unit of an N+M stage GOA unit through the cascade lines, wherein N and M are integers greater than zero; and the signal lines are connected to the pull-up unit of the GOA units.

In some embodiments, a thin film transistor (TFT) of the GOA circuit adopts a top gate structure that includes a first metal layer, a second metal layer, and a third metal layer, the grid lines and a shading layer of the thin film transistor are located in the first metal layer, the cascade lines and a gate of the thin film transistor are located in the second metal layer, and the signal lines and a source and a drain of the thin film transistor are located in the third metal layer.

In some embodiments, the top gate structure further includes a first dielectric layer and a second dielectric layer, the first dielectric layer is disposed between the first metal layer and the second metal layer, and the second dielectric layer is disposed between the second metal layer and the third metal layer.

In some embodiments, a thin film transistor of the GOA circuit adopts a bottom gate structure that includes a fourth metal layer and a fifth metal layer, the grid lines and a gate of the thin film transistor are located in the fourth metal layer, and the cascade lines, the signal lines, and a source and a drain of the thin film transistor are located in the fifth metal layer.

In some embodiments, the bottom gate structure further includes a third dielectric layer disposed between the fourth metal layer and the fifth metal layer.

As a second aspect, embodiments of the present application further provides a GOA circuit that includes: at least two cascaded GOA units; connecting lines connected to the cascaded GOA units and configured to realize circuit connection and signal transmission; and grid lines disposed in a different layer from the connecting lines and corresponding to disposed positions of the connecting lines, wherein, for a short circuit or open circuit malfunction nearby area of the connecting lines, the grid lines are configured to repair the connecting lines to repair the GOA circuit by using one or more of three methods of melting and disconnecting a part of the grid lines, melting and disconnecting a part of the connecting lines, or welding together the part of the grid lines and the part of the connecting lines.

In some embodiments, the connecting lines include cascade lines and signal lines; each stage of the GOA units includes a pull-up unit and a pull-up control unit connected to each other, and the pull-up unit of an N stage GOA unit is connected to the pull-up control unit of an N+M stage GOA unit through the cascade lines, wherein N and M are integers greater than zero; and the signal lines are connected to the pull-up unit of the GOA units.

In some embodiments, a thin film transistor (TFT) of the GOA circuit adopts a top gate structure that includes a first metal layer, a second metal layer, and a third metal layer, the grid lines and a shading layer of the thin film transistor are located in the first metal layer, the cascade lines and a gate of the thin film transistor are located in the second metal layer, and the signal lines and a source and a drain of the thin film transistor are located in the third metal layer.

In some embodiments, the top gate structure further includes a first dielectric layer and a second dielectric layer, the first dielectric layer is disposed between the first metal layer and the second metal layer, and the second dielectric layer is disposed between the second metal layer and the third metal layer.

In some embodiments, a thin film transistor of the GOA circuit adopts a bottom gate structure that includes a fourth metal layer and a fifth metal layer, the grid lines and a gate of the thin film transistor are located in the fourth metal layer, and the cascade lines, the signal lines, and a source and a drain of the thin film transistor are located in the fifth metal layer.

In some embodiments, the bottom gate structure further includes a third dielectric layer disposed between the fourth metal layer and the fifth metal layer.

As a third aspect, embodiments of the present application further provides a display panel that includes the above-mentioned GOA circuit, and the GOA circuit includes: at least two cascaded GOA units; connecting lines connected to the cascaded GOA units and configured to realize circuit connection and signal transmission; and grid lines disposed in a different layer from the connecting lines and corresponding to disposed positions of the connecting lines, wherein, for a short circuit or open circuit malfunction nearby area of the connecting lines, the grid lines are configured to repair the connecting lines to repair the GOA circuit by using one or more of three methods of melting and disconnecting a part of the grid lines, melting and disconnecting a part of the connecting lines, or welding together the part of the grid lines and the part of the connecting lines.

In some embodiments, the connecting lines include cascade lines and signal lines; each stage of the GOA units includes a pull-up unit and a pull-up control unit connected to each other, and the pull-up unit of an N stage GOA unit is connected to the pull-up control unit of an N+M stage GOA unit through the cascade lines, wherein N and M are integers greater than zero; and the signal lines are connected to the pull-up unit of the GOA units.

In some embodiments, a thin film transistor (TFT) of the GOA circuit adopts a top gate structure that includes a first metal layer, a second metal layer, and a third metal layer, the grid lines and a shading layer of the thin film transistor are located in the first metal layer, the cascade lines and a gate of the thin film transistor are located in the second metal layer, and the signal lines and a source and a drain of the thin film transistor are located in the third metal layer.

In some embodiments, the top gate structure further includes a first dielectric layer and a second dielectric layer, the first dielectric layer is disposed between the first metal layer and the second metal layer, and the second dielectric layer is disposed between the second metal layer and the third metal layer.

In some embodiments, a thin film transistor of the GOA circuit adopts a bottom gate structure that includes a fourth metal layer and a fifth metal layer, the grid lines and a gate of the thin film transistor are located in the fourth metal layer, and the cascade lines, the signal lines, and a source and a drain of the thin film transistor are located in the fifth metal layer; and the bottom gate structure further includes a third dielectric layer disposed between the fourth metal layer and the fifth metal layer.

The present application provides grid lines disposed in a different layer from connecting lines and corresponding to disposed positions of the connecting lines. When a short circuit or open circuit malfunction occurs in the connecting lines, according to a type of the malfunction, determining to adopt one or combinations of melting and disconnecting a part of the grid lines near a short circuit or open circuit, melting and disconnecting a part of the connecting lines near the short circuit or open circuit, or welding together the part of the grid lines and the part of the connecting lines, to repair or replace the dysfunctional part of the connecting lines, thereby realizing a purpose of repairing the GOA circuit, and preventing a technical problem of GOA circuit failure when internal bridging has the short circuit or open circuit malfunction.

BRIEF DESCRIPTION OF THE SEVERAL VIEWS OF THE DRAWINGS

FIG. 1 is a structural schematic diagram of a gate driver on array (GOA) circuit according to an embodiment of the present application.

FIG. 2 is a flowchart of a repair method of a GOA circuit according to an embodiment of the present application.

DESCRIPTION OF SPECIFIC EMBODIMENTS OF THE INVENTION

Figure 3:
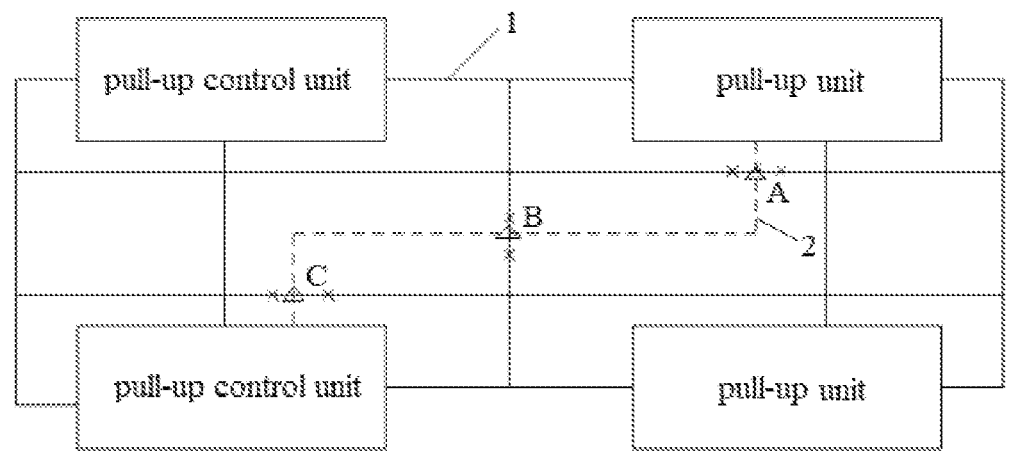
FIG. 3 is a schematic diagram of a first repair manner of a repair method of a GOA circuit according to an embodiment of the present application.

In order to make a purpose, technical approach, and effect of the present application more clear and definite, the following describes the present application in detail using embodiments with reference to accompanying drawings. It should be understood that specific embodiments described here are merely used to explain the present application and not intended to limit the present application.

A structure of a gate driver on array (GOA) circuit is complicated and with more internal connecting lines, an internal malfunction such as an open circuit caused by electrostatic discharge (ESD) (i.e. electrostatic breakdown) or a short circuit caused by deficient manufacturing processes can easily occur. Currently, to repair wirings in GOA circuits generally requires masking processes, which is complicated, inconvenient, and increases maintenance cost. In order to resolve the above-mentioned problems, embodiments of the present application provide a GOA circuit, a display panel, and a repair method.

Referring to FIG. 1, FIG. 1 is a structural schematic diagram of a GOA circuit according to an embodiment of the present application. The embodiment of the present application provides a GOA circuit that includes:

At least two cascaded GOA units;

Connecting lines 2, 3, and 4 connected to the cascaded GOA units and configured to realize circuit connection and signal transmission; and Grid lines 1 disposed in a different layer from the connecting lines 2, 3, and 4 and corresponding to disposed positions of the connecting lines 2, 3, and 4; wherein when a short circuit or open circuit malfunction occurs at the connecting lines 2, 3, or 4, the grid lines 1 are configured to repair a part of the connecting lines 2, 3, or 4 to repair the GOA circuit by using one or more of three methods of melting and disconnecting a part of the grid lines 1, melting and disconnecting the part of the connecting lines 2, 3, or 4, or welding together the part of the grid lines 1 and the part of the connecting lines 2, 3, or 4.

It should be explained that in FIG. 1, the grid lines 1 are a solid line, and the connecting lines 2, 3, and 4 are dotted lines.

Specifically, in order to facilitate repair of the connecting lines when a short circuit or open circuit malfunction occurs in the connecting lines, the grid lines are disposed in a different layer from a layer of the connecting lines, and the disposed position of the grid lines in the different layer corresponds to the disposed positions of the connecting lines in its layer.

When a short circuit or open circuit malfunction occurs in the connecting lines 2, 3, or 4, the embodiment of the present application chooses one or more of three methods of melting and disconnecting a part of the grid lines 1 near an area of a short circuit or open circuit, melting and disconnecting a part of the connecting lines 2, 3, or 4 near the short circuit or open circuit, or welding together a melted part of the grid lines 1 and disconnected parts of the connecting lines 2, 3, or 4 to repair or replace the part of the connecting lines 2, 3, or 4 where the malfunction occurs. This successfully repairs or replaces the malfunction, such that a normal connection is restored in the connecting lines 2, 3, or 4, thereby facilitating repair of the GOA circuit when the short circuit or open circuit malfunction occurs in the connecting lines 2, 3, or 4. The embodiment of the present application can realize repairs of the GOA circuit without adding masking processes, increasing repair efficiency of the GOA circuit, and saving repair cost.

In some embodiments, as shown in FIG. 1, the connecting lines 2, 3, and 4 include cascade lines 2 and signal lines 3 and 4, wherein the cascade lines 2 are a dashed line, and the signal lines 3 and 4 are dotted lines. The connecting lines 2, 3, and 4 in the GOA circuit are configured for circuit connection and signal transmission between the cascaded GOA units, and the connecting lines 2, 3, and 4 are divided into the cascade lines 2 and the signal lines 3 and 4, wherein one end of each of the cascade lines 2 is connected to a pull-up unit of a previous stage GOA unit, and the other end is connected to a pull-up control unit of a next stage GOA unit. Each of the signal lines 3 or 4 is connected to a pull-up unit of its corresponding GOA unit, the corresponding GOA unit of the signal lines 3 or 4 is a GOA unit whose circuit connection and signal transmission depend on the signal lines, and the signal lines 3 or 4 are connected to the pull-up unit of the GOA unit and configured for the circuit connection and signal transmission of the GOA unit.

It should be explained that the signal lines in the GOA circuit include a feedback signal line, a clock CK line, a constant high voltage VGH line, a constant low voltage VGL line, etc., and the signal lines 3 and 4 according to embodiments of the present application are merely for illustration and represent multiple signal lines in the GOA circuit, to facilitate following explanation and description of embodiments of the GOA circuit and a repair method thereof.

Similarly, any number of multiple grid lines 1 can be disposed between two cascaded GOA units in a horizontal and a vertical direction, respectively. Grid lines 1 in FIG. 1 are merely for illustration and represent multiple grid lines 1 between two cascaded GOA units to facilitate following explanation and description of embodiments of the GOA circuit and the repair method thereof.

FIG. 2 is a flowchart of a repair method of a GOA circuit according to an embodiment of the present application. Referring to FIG. 1 and FIG. 2, the embodiment of the present application provides a repair method of a GOA circuit, wherein the GOA circuit includes at least two cascaded GOA units and connecting lines 2, 3, and 4 connected to the cascaded GOA units, and the repair method of the GOA circuit includes:

S1, providing grid lines 1 disposed in a different layer from the connecting lines 2, 3, and 4, wherein the grid lines 1 correspond to disposed positions of the connecting lines 2, 3, and 4.

Specifically, the grid lines 1 arranged in a grid pattern are disposed in a different layer from a layer of the connecting lines 2, 3, and 4 configured to connect cascaded GOA units, and a disposed position of the grid lines 1 in the different layer corresponds to the disposed positions of the connecting lines 2, 3, and 4 in its layer, which facilitates repair or replacement of the connecting lines 2, 3, and 4 by using the corresponding grid lines 1 when a short circuit or open circuit malfunction occurs in the connecting lines 2, 3, and 4.

S2, if a short circuit or open circuit malfunction occurs in the connecting lines 2, 3, or 4, adopting one or more of three methods of melting and disconnecting a part of the grid lines 1 near a short circuit or open circuit, melting and disconnecting a part of the connecting lines 2, 3, or 4 near the short circuit or open circuit, or welding together the part of the grid lines 1 and the part of the connecting lines 2, 3, or 4 to repair the connecting lines and the GOA circuit.

Specifically, if the short circuit or open circuit malfunction occurs in the connecting lines 2, 3, or 4, a repair method is determined according to a type and a position of the malfunction, choosing the one or more of three methods of melting and disconnecting the part of the grid lines 1 near the short circuit or open circuit, melting and disconnecting the part of the connecting lines 2, 3, or 4 near the short circuit or open circuit, or welding together the part of the grid lines 1 melted apart and the part of the connecting lines 2, 3, or 4 melted apart to repair the connecting lines 2, 3, or 4 to which the malfunction happens, or using the part of the grid lines 1 to replace the connecting lines 2, 3, or 4 to which the malfunction happens, and finally making the connecting lines restore a normal connection, that is, the GOA circuit resumes normal.

The embodiment of the present application can realize repair of the GOA circuit without adding masking processes, increasing repair efficiency and saving repair cost.

In some embodiments, the repair method of the GOA circuit specifically includes: if a short circuit malfunction occurs between the connecting lines 2, 3, or 4 and the grid lines 1, melting and disconnecting a part of the grid lines 2, 3, or 4 near a short circuit between the connecting lines and the grid lines to repair the connecting lines.

Specifically, if the short circuit malfunction occurs between the connecting lines 2, 3, or 4 and the grid lines 1, that is, there exists a point of short circuiting between the connecting lines 2, 3, or 4 and the grid lines 1, melting and disconnecting the part of the grid lines 1 near the short circuit between the connecting lines 2, 3, or 4 and the grid lines 1, thereby repairing the short circuiting points between the connecting lines 2, 3, or 4 and the grid lines 1, such that there is no short circuiting between the connecting lines 2, 3, or 4 and the grid lines 1. Therefore, the connecting lines 2, 3, or 4 are repaired and the GOA circuit resumes normal.

When a short circuit malfunction occurs between the connecting lines 2, 3, or 4 and the grid lines 1, embodiments of the present application directly melt apart the grid lines 1 near a short circuit to make the connecting lines 2, 3, or 4 resume normal, thereby simply and quickly restoring normal functionality to the GOA circuit.

For example, referring to FIG. 3, FIG. 3 is a schematic diagram of a first repair manner of a repair method of a GOA circuit according to an embodiment of the present application. If the short circuit exists at point A, B, or C (triangles in FIG. 3) between the grid lines 1 and the connecting line (cascade line) 2, then melting and disconnecting a part of the grid lines 1 at a nearby area of point A, B, or C (crosses on the grid lines 1 at a nearby area of point A, B, or C in FIG. 3), thereby repairing the cascade line 2.

Figure 4:
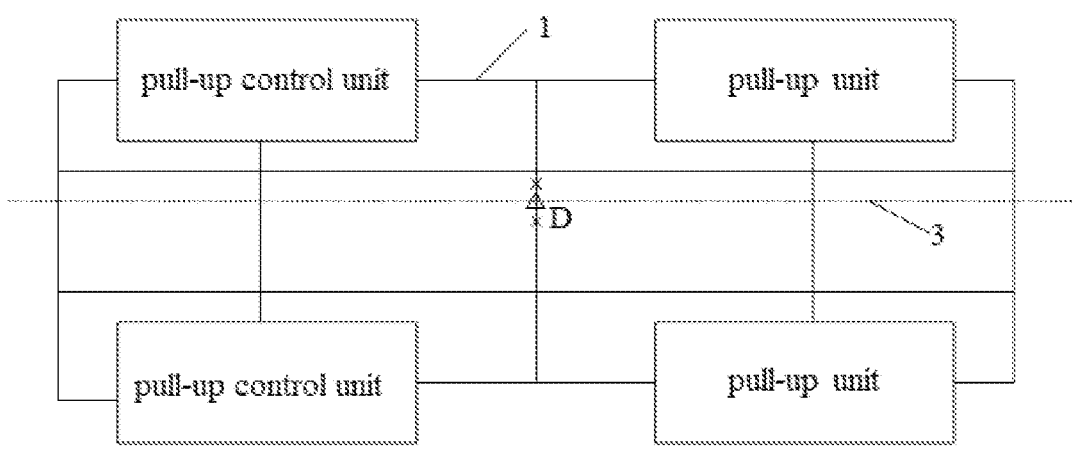
FIG. 4 is a schematic diagram of a second repair manner of the repair method of the GOA circuit according to an embodiment of the present application.

Another example, referring to FIG. 4, FIG. 4 is a schematic diagram of a second repair manner of the repair method of the GOA circuit according to an embodiment of the present application. If there exists short circuiting at point D (triangles in FIG. 4) between the grid lines 1 and the connecting line (signal line) 3, then melting and disconnecting a part of the grid lines at a nearby area of point D (crosses on the grid lines 1 at a nearby area of point D in FIG. 4), thereby repairing the signal line 3.

In some embodiments, a repair method of a GOA circuit specifically includes: if a short circuit or open circuit malfunction occurs in the connecting lines, melting and disconnecting a part of the connecting lines near a short circuit or open circuit and a part of the grid lines, and welding together the part of the grid lines and the part of the connecting lines, to form a bridge line consisting of the part of the grid lines that is configured to replace the part of the connecting lines.

Specifically, if a short circuit or open circuit malfunction occurs in the connecting lines, then melting and disconnecting the part of the connecting lines near the short circuit or open circuit and the part of the grid lines, thereby precluding a short circuit or open circuit malfunction point of the connecting lines, and then welding together corresponding points of the part of the connecting lines and the part of the grid lines melted apart, that is, overlapping points in a vertical direction of the part of the connecting lines and the part of the grid lines, such that one end of the part of the connecting lines is welded to one end of the part of the grid lines, and the other end of the part of the connecting lines is welded to the other end of the part of the grid lines, thereby forming the bridge line consisting of the part of the grid lines that is used to replace the part of the connecting lines, such that after the part of the connecting lines near the short circuit or open circuit is melted apart, replacing by the part of the grid lines to which the part of the connecting lines is welded, thereby making the connecting lines resume a normal connection through corresponding grid lines, and repairing the GOA circuit.

When a short circuit or open circuit malfunction occurs in the connecting lines, embodiments of the present application first melt apart a part of the connecting lines near a short circuit or open circuit to preclude a short circuit or open circuit point, and then use the grid lines corresponding to disposed positions of the connecting lines to also melt apart a part of the grid lines near the short circuit or open circuit, and weld together the part of the connecting lines and the part of the grid lines melted apart to form a bridge line consisting of the part of the grid lines that is configured to replace the part of the connecting lines, and produce a new connecting line consisting of a part of the original connecting lines that is not melted apart and the bridge line, thereby restoring normal functionality to the GOA circuit.

Figure 5:
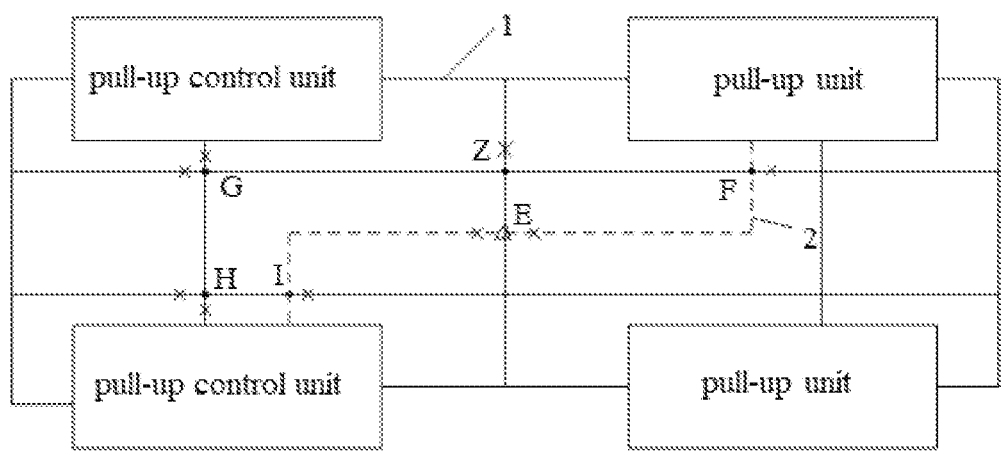
FIG. 5 is a schematic diagram of a third repair manner of the repair method of the GOA circuit according to an embodiment of the present application.

For example, referring to FIG. 5, FIG. 5 is a schematic diagram of a third repair manner of the repair method of the GOA circuit according to an embodiment of the present application.

If a short circuit or open circuit malfunction occurs at point E between the grid lines 1 and the connecting line (cascade line) 2 (triangle in FIG. 5), then by first melting and disconnecting a part of the cascade line 2 at a nearby area of point E (crosses on the cascade line 2 at the nearby area of point E in FIG. 5) to preclude point E, and then also melting and disconnecting a part of the grid lines 1 at the nearby area of point E (crosses on the grid lines 1 at nearby areas of points F, Z, G, H, and I in FIG. 5), and welding together the grid lines 1 and the cascade line 2 at point F and point I, one produces a bridge line consisting of the part of the grid lines 1 melted apart (the part of the grid lines of points F, Z, G, H, and I in FIG. 5) that is configured to replace the part of the cascade line 2 (the part of the cascade line of points F, E, and I in FIG. 5). That is, by using the part of the grid lines of points F, Z, G, H, and I to replace the part of the cascade line of points F, E, and I, the part of the cascade line of points F, E, and I of the original cascade line 2 is repaired by producing a new cascade line consisting of the part of the grid lines of points F, Z, G, H, and I.

It can be understood that crosses on the cascade line 2 at the nearby area of point E in FIG. 5 can also be ones close to point F or point I, as long as being able to preclude point E and the short circuit or open circuit malfunction.

In some embodiments, a repair method of a GOA circuit specifically includes: if a short circuit or open circuit malfunction occurs between the cascade lines 2 and the signal lines 3 or 4, melting and disconnecting a first part of the grid lines, a second part of the grid lines, a part of the cascade lines 2, and a part of the signal lines 3 or 4 near a short circuit or open circuit between the cascade lines 2 and the signal lines 3 or 4, and welding together the first part of the grid lines and the part of the cascade lines 2, to form a first bridge line consisting of the first part of the grid lines that is configured to replace the part of the cascade line 2, while welding together the second part of the grid lines and the part of the signal lines 3 or 4, to form a second bridge line consisting of the second part of the grid lines that is configured to replace the part of the signal lines 3 or 4.

Specifically, for a situation that the short circuit or open circuit malfunction occurs between the cascade lines 2 and the signal lines 3 or 4, melting and disconnecting the part of the cascade lines 2 and the part of the signal lines 3 or 4 near the short circuit or open circuit between the cascade lines 2 and the signal lines 3 or 4, thereby precluding short circuit or open circuit points of the cascade lines 2 and the signal lines 3 or 4, while melting and disconnecting the first part of the grid lines and the second part of the grid lines near the short circuit or open circuit between the cascade lines 2 and the signal lines 3 or 4, welding together the first part of the grid lines and the part of the cascade lines to form the first bridge line consisting of the first part of the grid lines that is configured to replace the part of the cascade line, and welding together the second part of the grid lines and the part of the signal lines to form the second bridge line consisting of the second part of the grid lines that is configured to replace the part of the signal lines. Thereby, a new cascade line consisting of a part of the original cascade lines that is not melted apart and the first bridge line is produced, and a new signal line consisting of a part of the original signal lines that is not melted apart and the second bridge line is produced, thereby restoring normal functionality to the GOA circuit.

Figure 6:
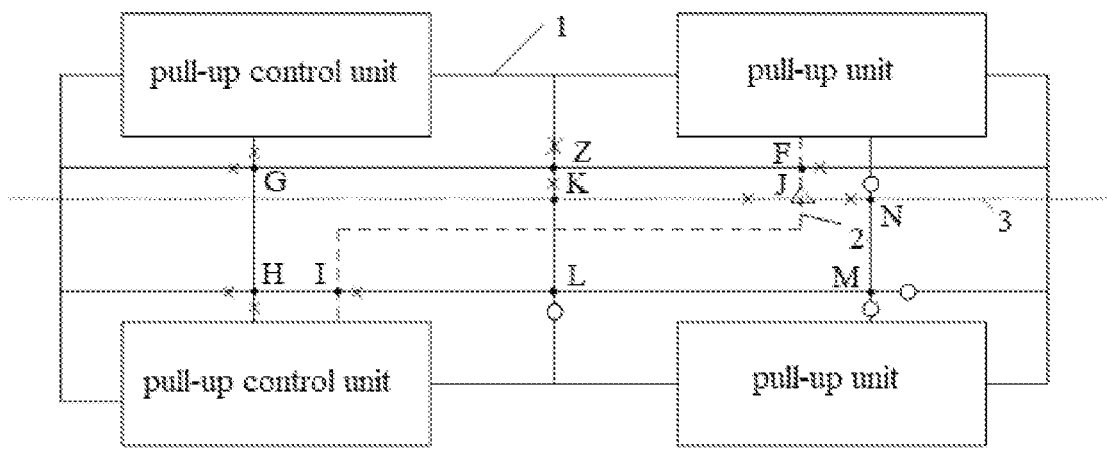
FIG. 6 is a schematic diagram of a fourth repair manner of the repair method of the GOA circuit according to an embodiment of the present application.

For example, referring to FIG. 6, FIG. 6 is a schematic diagram of a fourth repair manner of the repair method of the GOA circuit according to an embodiment of the present application.

If a short circuit or open circuit malfunction occurs at point J between the cascade line 2 and the signal line 3 (triangle in FIG. 6), then by first melting and disconnecting a part of the cascade line 2 or a part of the signal line 3 at a nearby area of point J (crosses on the signal line 3 at the nearby area of point J in FIG. 6) to preclude point J, and then also melting and disconnecting a first part of the grid lines at the nearby area of point J (crosses on the grid lines 1 at nearby areas of points F, Z, G, H, and I in FIG. 6), and welding together the grid lines 1 and the cascade line 2 at point F and point I, one forms a first bridge line consisting of the first part of the grid lines (a part of the grid lines of points F, Z, G, H, and I in FIG. 6) that is configured to replace the part of the cascade line 2 (a part of the cascade line of points F, J, and I in FIG. 6). That is, by using the part of the grid lines of points F, Z, G, H, and I to replace the part of the cascade line of points F, J, and I, the part of the cascade line of points F, J, and I of the original cascade line 2 is repaired by producing a new cascade line consisting of the part of the grid lines of points F, Z, G, H, and I.

Furthermore, after precluding point J, further melting and disconnecting a part of the grid lines 1 at the nearby area of point J (hollow circles on the grid lines 1 at nearby areas of points K, L, M, and N in FIG. 6), and welding together the grid lines 1 and the signal line 3 at point K and point N to form a second bridge line consisting of a second part of the grid lines (a part of the grid lines of points K, L, M, and N in FIG. 6) that is configured to replace the part of the signal line 3 (a part of the signal line of points K, J, and N in FIG. 6). That is, using the part of the grid lines of points K, L, M, and N to replace the part of the signal line of points K, J, and N, thereby repairing the part of the signal line of points K, J, and N of the original signal line 3 by producing a new signal line consisting of the part of the grid lines of points K, L, M, and N.

Figure 7:
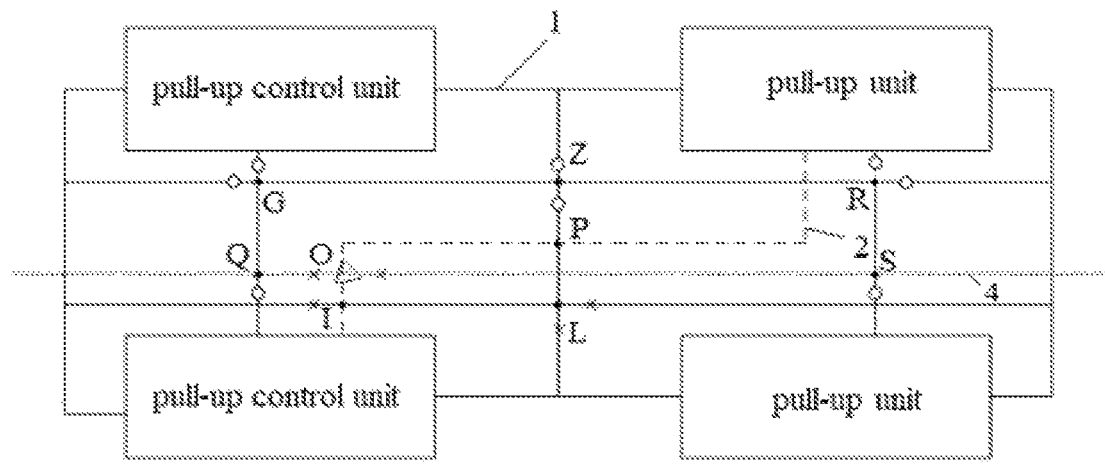
FIG. 7 is a schematic diagram of a fifth repair manner of the repair method of the GOA circuit according to an embodiment of the present application.

Another example, referring to FIG. 7, FIG. 7 is a schematic diagram of a fifth repair manner of the repair method of the GOA circuit according to an embodiment of the present application.

If a short circuit or open circuit malfunction occurs at point O between the cascade line 2 and the signal line 4 (triangle in FIG. 7), then first melting and disconnecting a part of the cascade line 2 or a part of the signal line 4 at a nearby area of point O (crosses on the signal line 4 at the nearby area of point O in FIG. 7) to preclude point O, and then also melting and disconnecting a first part of the grid lines at the nearby area of point O (crosses on the grid lines 1 at nearby areas of points I and L in FIG. 7), and welding together the grid lines 1 and the cascade line 2 at point P and point I to form a first bridge line consisting of the first part of the grid lines (a part of the grid lines of points P, L, and I in FIG. 7) that is configured to replace the part of the cascade line 2 (a part of the cascade line of points P, O, and I in FIG. 7). That is, using the part of the grid lines of points P, L, and I to replace the part of the cascade line of points P, O, and I, thereby repairing the part of the cascade line of points P, O, and I of the original cascade line 2 by producing a new cascade line consisting of the part of the grid lines of points P, L, and I.

Furthermore, after precluding point O, further melting and disconnecting a part of the grid lines 1 at the nearby area of point O (hollow circles on the grid lines 1 at nearby areas of points R, Z, G, and Q in FIG. 7), and welding together the grid lines 1 and the signal line 4 at point S and point Q to form a second bridge line consisting of a second part of the grid lines (a part of the grid lines of points S, R, Z, G, and Q in FIG. 7) that is configured to replace the part of the signal line 4 (a part of the signal line of points S, O, and Q in FIG. 7). That is, using the part of the grid lines of points S, R, Z, G, and Q to replace the part of the signal line of points S, O, and Q, thereby repairing the part of the signal line of points S, O, and Q of the original signal line 4 by producing a new signal line consisting of the part of the grid lines of points S, R, Z, G, and Q.

In some embodiments, each stage of the GOA units includes a pull-up unit and a pull-up control unit connected to each other, and a pull-up unit of an N stage GOA unit is connected to a pull-up control unit of an N+M stage GOA unit through a cascade line 2, wherein N and M are integers greater than zero. Signal lines 3 or 4 are connected to a pull-up unit of a corresponding GOA unit.

Specifically, a direct cascade manner or an indirect cascade manner can be adopted between cascaded GOA units of a GOA circuit, wherein the direct cascade manner means M=1, that is, there is no other GOA unit between a previous stage GOA unit and a next stage GOA unit cascaded therewith. For example, a first stage GOA unit is connected to a second stage GOA unit, and a second stage GOA unit is connected to a third stage GOA unit. The indirect cascade manner means M>1, that is, there is another GOA unit between a previous stage GOA unit and a next stage GOA unit cascaded therewith. For example, a first stage GOA unit is connected to a third stage GOA unit, and a second stage GOA unit is connected to a fourth stage GOA unit.

Therefore, a previous stage GOA unit and a next stage GOA unit connected by the cascade line adopt a direct cascade manner (M=1) or an indirect cascade manner (M>1), and a signal is transmitted to the next stage GOA unit through the previous stage GOA unit. The signal lines are connected to a pull-up unit of a corresponding GOA unit, and a signal is transmitted to the GOA unit through the pull-up unit of the corresponding GOA unit.

It should be explained that one of the direct cascade manner (M=1) and the indirect cascade manner (M>1) can be adopted between all cascaded GOA units of a GOA circuit. Otherwise, in any one GOA circuit, a value of M is not unique. That is, in any one GOA circuit, a part of cascaded GOA units adopt the direct cascade manner (M=1), while other part of the cascaded GOA units adopt the indirect cascade manner (M>1), as long as each next stage GOA unit is ensured to be connected to a previous stage GOA unit, such that the previous stage GOA unit is connected to the next stage GOA unit and transmits a signal.

When M=2, it means an N stage GOA unit is cascaded with an N+2 stage GOA unit.

Figure 8:
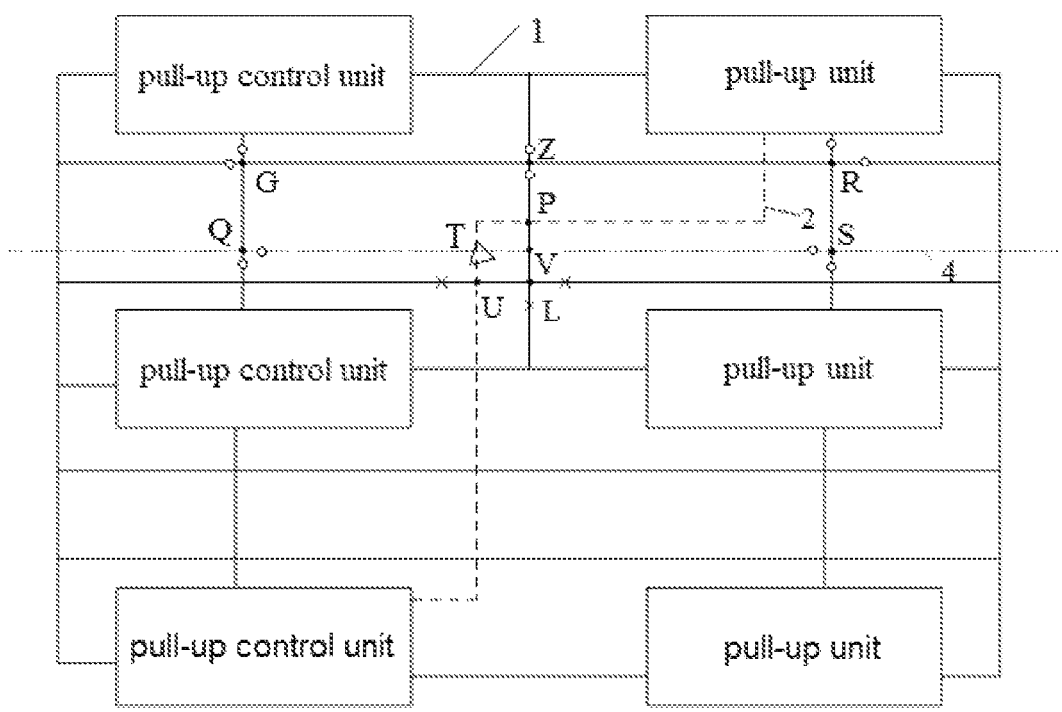
FIG. 8 is a schematic diagram of a sixth repair manner of the repair method of the GOA circuit according to an embodiment of the present application.

For example, referring to FIG. 8, FIG. 8 is a schematic diagram of a sixth repair manner of the repair method of the GOA circuit according to an embodiment of the present application. If a short circuit or open circuit malfunction occurs at point T of the cascade line 2 and the signal line 4 (triangle in FIG. 8), then first melting and disconnecting a part of the cascade line 2 or a part of the signal line 4 at a nearby area of point T (crosses on the signal line 4 at the nearby area of point T in FIG. 8) to preclude point T, and then also melting and disconnecting a first part of the grid lines at the nearby area of point T (crosses on the grid lines 1 at nearby areas of points U and L in FIG. 8), and welding together the grid lines 1 and the cascade line 2 at point V and point U to form a first bridge line consisting of the first part of the grid lines (a part of the grid lines of points P, V, L, and U in FIG. 8) that is configured to replace the part of the cascade line 2 (a part of the cascade line of points P, T, and U in FIG. 8). That is, using the part of the grid lines of points P, V, L, and U to replace the part of the cascade line of points P, T, and U, thereby routing the part of the cascade line of points P, T, and U of the original cascade line 2 along the part of the grid lines of points P, V, L, and U to produce a new cascade line and repairing the original cascade line 2.

Furthermore, after precluding point T, further melting and disconnecting a part of the grid lines 1 at the nearby area of point T (hollow circles on the grid lines 1 at nearby areas of points R, Z, G, and Q in FIG. 8), and welding together the grid lines 1 and the signal line 4 at point S and point Q to form a second bridge line consisting of a second part of the grid lines (a part of the grid lines of points S, R, Z, G, and Q in FIG. 8) that is configured to replace the part of the signal line 4 (a part of the signal line of points S, T, and Q in FIG. 8). That is, using the part of the grid lines of points S, R, Z, G, and Q to replace the part of the signal line of points S, T, and Q, thereby routing the part of the signal line of points S, T, and Q of the original signal line 4 along the part of the grid lines of points S, R, Z, G, and Q to produce a new signal line and repairing the original signal line 4.

Figure 9:
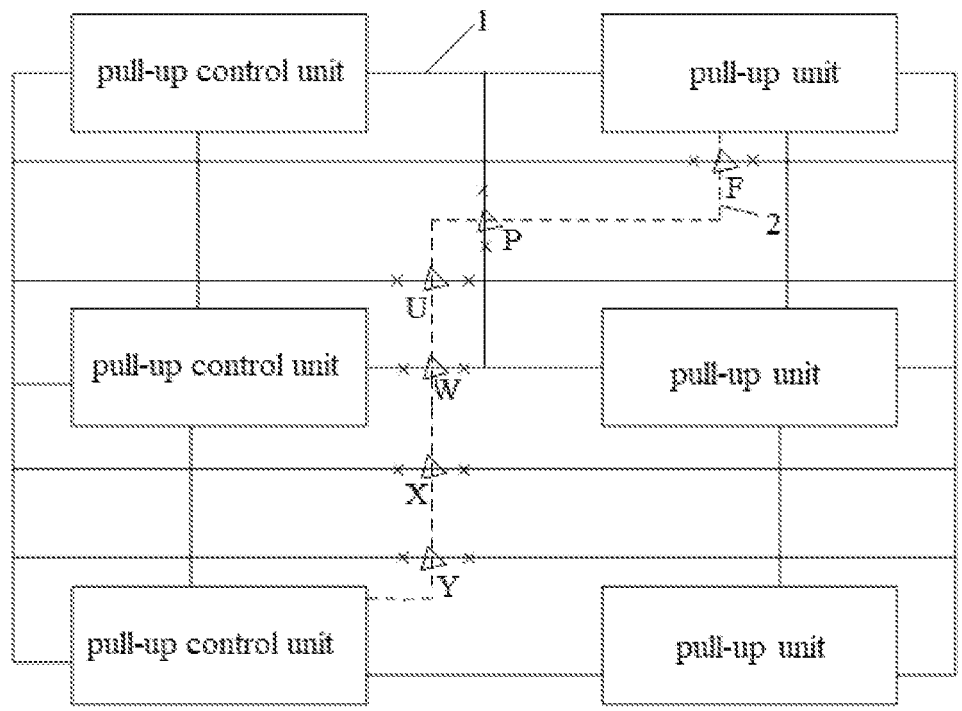
FIG. 9 is a schematic diagram of a seventh repair manner of the repair method of the GOA circuit according to an embodiment of the present application.

Referring to FIG. 9, FIG. 9 is a schematic diagram of a seventh repair manner of the repair method of the GOA circuit according to an embodiment of the present application. If there exists short circuiting at point F, P, U, W, X, or Y (triangles in FIG. 9) between the grid lines 1 and the cascade line 2, then melting and disconnecting a part of the grid lines 1 at a nearby area of point F, P, U, W, X, or Y (crosses on the grid lines 1 at the nearby area of point F, P, U, W, X, or Y in FIG. 9), thereby repairing the cascade line 2.

It should be explained that a device structure of thin film transistors (TFTs) adopts multiple metal layers, a general top gate structure adopts three metal layers, and a bottom gate structure adopts two metal layers.

Figure 10:
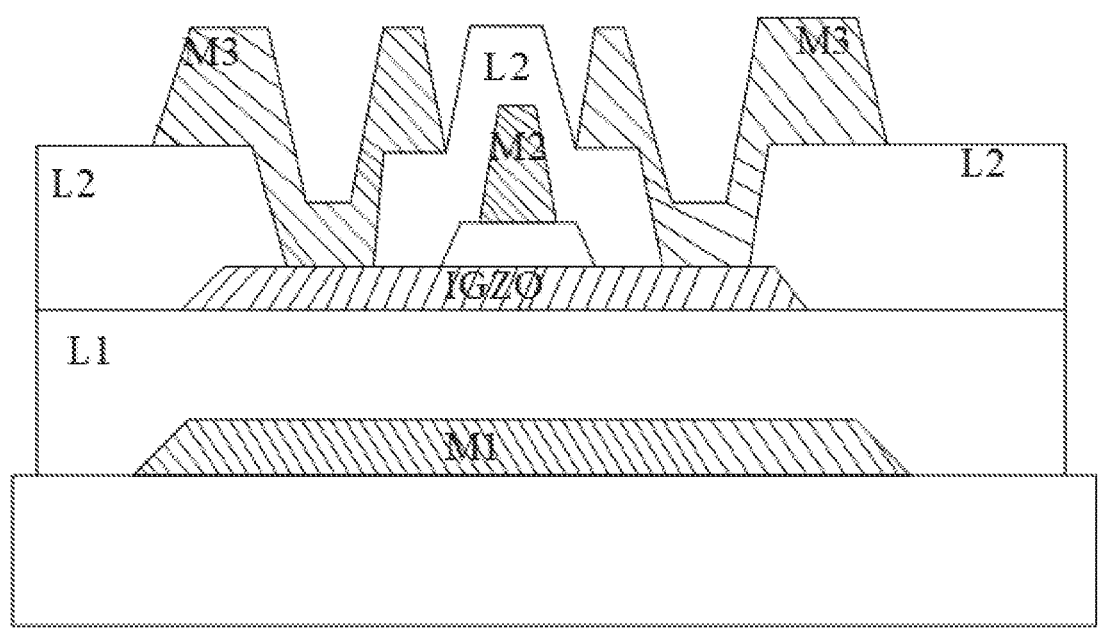
FIG. 10 is a sectional view of a thin film transistor (TFT) in a GOA circuit according to an embodiment of the present application.

Referring to FIG. 10, FIG. 10 is a sectional view of a thin film transistor (TFT) in a GOA circuit according to an embodiment of the present application. The thin film transistor of the GOA circuit adopts a top gate structure that includes a first metal layer M1, a second metal layer M2, and a third metal layer M3. The grid lines 1 and a shading layer of the thin film transistor are located in the first metal layer M1, the cascade lines 2 and a gate of the thin film transistor are located in the second metal layer M2, and the signal lines 3 or 4 and a source and a drain of the thin film transistor are located in the third metal layer M3.

Specifically, the thin film transistor according to the embodiment of the present application adopts the top gate structure that generally includes three metal layers: the first metal layer M1, the second metal layer M2, and the third metal layer M3. The shading layer of the thin film transistor is located in the first metal layer M1, the gate is located in the second metal layer M2, and the source and the drain are located in the third metal layer M3. The grid lines 1, the cascade lines 2, and the signal lines 3 or 4 according to embodiments of the present application are located in three different layers. Wherein, the grid lines 1 and the shading layer of the thin film transistor are located in the same first metal layer M1, the cascade lines 2 and the gate of the thin film transistor are located in the same second metal layer M2, and the signal lines 3 or 4 and the source and the drain of the thin film transistor are located in the same third metal layer M3. Hence, the grid lines 1, the cascade lines 2, and the signal lines 3 or 4 are disposed in different layers.

Furthermore, the top gate structure generally further includes two dielectric layers: a first dielectric layer L1 and a second dielectric layer L2, wherein the first dielectric layer L1 is disposed between the first metal layer M1 and the second metal layer M2, and the second dielectric layer L2 is disposed between the second metal layer M2 and the third metal layer M3. Hence, the first dielectric layer L1 and the second dielectric layer L2 are situated between the grid lines 1 and the signal lines 3 or 4, and it can be regarded that a short circuit or open circuit malfunction does not easily occur between the grid lines 1 and the signal lines 3 or 4. Meanwhile, as the first dielectric layer L1 is situated between the grid lines 1 and the cascade lines 2, and as the second dielectric layer L2 is situated between the cascade lines 2 and the signal lines 3 or 4, the short circuit or open circuit malfunction will easily occur between the grid lines 1 and the cascade lines 2 or between the cascade lines 2 and the signal lines 3 or 4, because the first dielectric layer L1 or the second dielectric layer L2 is thinner.

It can be understood that a shading layer of a thin film transistor is generally used to shade light for an active layer (i.e. indium gallium zinc oxide (IGZO) layer), thereby preventing a channel layer of a top gate structure being irradiated by light, which can lead to a problem of electrical failures of the thin film transistor.

Figure 11:
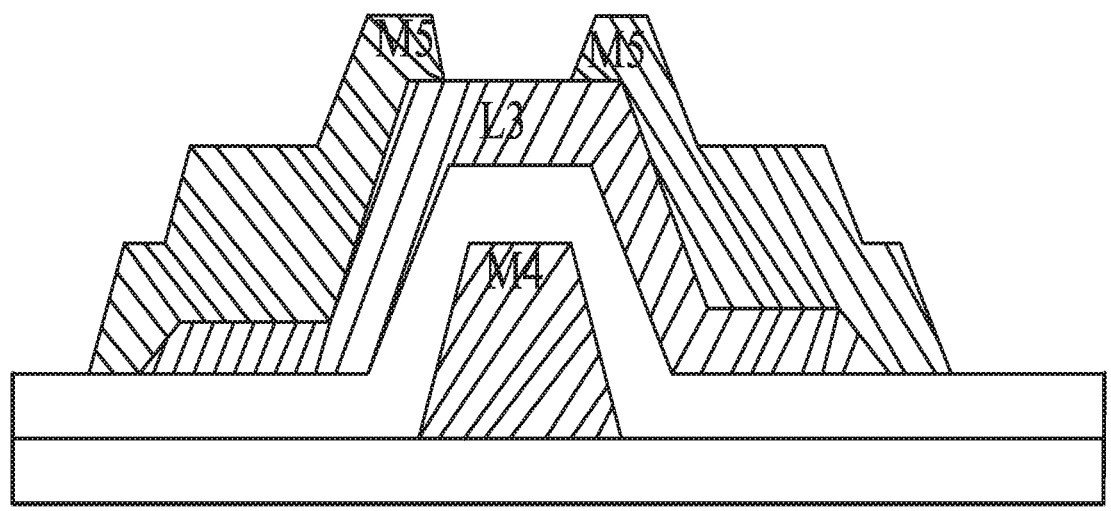
FIG. 11 is a sectional view of another thin film transistor (TFT) in a GOA circuit according to an embodiment of the present application.

Referring to FIG. 11, FIG. 11 is a sectional view of another thin film transistor in a GOA circuit according to an embodiment of the present application. The thin film transistor of the GOA circuit adopts a bottom gate structure that includes a fourth metal layer M4 and a fifth metal layer M5. The grid lines 1 and a gate of the thin film transistor are located in the fourth metal layer M4, and the cascade lines 2, the signal lines 3 or 4, and a source and a drain of the thin film transistor are located in the fifth metal layer M5.

Specifically, the thin film transistor according to the embodiment of the present application adopts the bottom gate structure that generally includes two metal layers: the fourth metal layer M4 and the fifth metal layer M5. The gate of the thin film transistor is located in the fourth metal layer M4, and the source and the drain are located in the fifth metal layer M5. The grid lines 1 and the gate of the thin film transistor according to the embodiment of the present application are located in the same fourth metal layer M4, and the cascade lines 2 and the signal lines 3 or 4 are located in a same layer, that is, the cascade lines 2, the signal lines 3 or 4, and the source and the drain of the thin film transistor are located in the same fifth metal layer M5. Wherein, a cross point of the cascade lines 2 and the signal lines 3 or 4 in the same layer adopts a via hole process, such that a short circuit or open circuit malfunction does not occur.

Furthermore, the bottom gate structure generally further includes a third dielectric layer L3 disposed between the fourth metal layer M4 and the fifth metal layer M5.

It should be explained that in comparison with the top gate structure adopting three metal layers and two dielectric layers, the bottom gate structure adopts two metal layers and one dielectric layer, and hence a short circuit or open circuit malfunction easily occurs between the grid lines and the signal lines of the bottom gate structure due to there being only one dielectric layer, while there are two dielectric layers between the grid lines and the signal lines of the top gate structure, and hence the short circuit or open circuit malfunction does not easily occur.

Furthermore, in spite of a certain extent of overlap capacitance produced to the signal lines when adopting the grid lines to repair the signal lines, however, because there is one or two dielectric layers between the grid lines and the signal lines, the overlap capacitance is very small, and when comparing to parasitic capacitance of thin film transistors of the GOA circuit it is negligible. It can be understood that there are two dielectric layers between the grid lines and the signal lines of the top gate structure, while only one dielectric layer is between the grid lines and the signal lines of the bottom gate structure, and hence overlap capacitance of the top gate structure is less than that of the bottom gate structure.

In addition, a mask process is unnecessary when repairing the connecting lines according to embodiments of the present application, and since additional masks are not needed, there is no additional cost.

Figure 12:
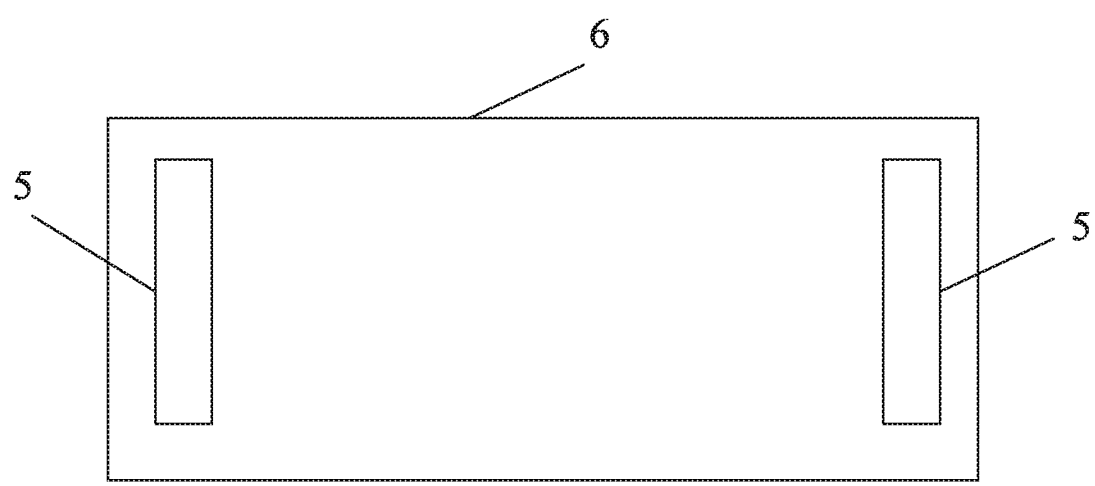
FIG. 12 is a structural schematic diagram of a display panel according to an embodiment of the present application.

FIG. 12 is a structural schematic diagram of a display panel according to an embodiment of the present application. Referring to FIG. 12, based on the above-mentioned embodiments, the embodiment of the present application further provides a display panel 6 that includes the aforementioned GOA circuit 5, and the display panel 6 has the same structure and beneficial effects as those of the aforementioned GOA circuit 5. Contents of a structure of the GOA circuit and the repair method have been described in detail in the above-mentioned embodiments, and repeated description is omitted here.

It can be understood that it is obvious to those skilled in the art having regard to this present application that other modifications of the exemplary embodiments beyond these embodiments specifically described here may be made without departing from the spirit of the application. Accordingly, such modifications are considered within the scope of the application as limited solely by the appended claims.

What is claimed is:

1. A repair method of a gate driver on array (GOA) circuit, wherein the GOA circuit comprises at least two cascaded GOA units and connecting lines connected to the cascaded GOA units, and the repair method of the GOA circuit comprises:
   providing grid lines that are disposed in a different layer from the connecting lines, to correspond to the connecting lines; and
   adopting one or more of three methods of melting and disconnecting a part of the grid lines near a short circuit or an open circuit, melting and disconnecting a part of the connecting lines near the short circuit or open circuit, or welding together the part of the grid lines and the part of the connecting lines, to repair the connecting lines and the GOA circuit if the short circuit or open circuit malfunction occurs at the connecting lines,
   wherein the connecting lines comprise cascade lines and signal lines, the cascade lines are configured to connect two cascaded GOA units, the signal lines are connected to the GOA units, and the repair method of the GOA circuit comprises:
   each of a first part of the grid lines, a second part of the grid lines, a part of the cascade lines, and a part of the signal lines near the short circuit or the open circuit between the cascade lines and the signal lines is melted and disconnected, the disconnected first part of the grid lines and the disconnected part of the cascade lines are welded together to form a first bridge line consisting of the first part of the grid lines that is configured to replace the part of the cascade lines, and the disconnected second part of the grid lines and the disconnected part of the signal lines are welded together to form a second bridge line consisting of the second part of the grid lines that is configured to replace the part of the signal lines, if the short circuit or open circuit malfunction occurs between the cascade lines and the signal lines.

2. The repair method of the GOA circuit as claimed in claim 1, wherein
   the part of the grid lines near the short circuit between the connecting lines and the grid lines is melted and disconnected to repair the connecting lines if the short circuit malfunction occurs between the connecting lines and the grid lines.

3. The repair method of the GOA circuit as claimed in claim 1, wherein
   each of the part of the connecting lines near the short circuit or open circuit and the part of the grid lines is melted and disconnected, and the disconnected part of the grid lines and the disconnected part of the connecting lines are welded together, to form a bridge line that is configured to replace the part of the connecting lines consisting of the part of the grid lines, if the short circuit or open circuit malfunction occurs at the connecting lines.

4. The repair method of the GOA circuit as claimed in claim 1, wherein each stage of the GOA units comprises a pull-up unit and a pull-up control unit connected to each other, and the pull-up unit of an N stage GOA unit is connected to the pull-up control unit of an N+M stage GOA unit through the cascade lines, wherein N and M are integers greater than zero; and the signal lines are connected to the pull-up unit of the GOA units.

5. The repair method of the GOA circuit as claimed in claim 4, wherein a thin film transistor (TFT) of the GOA circuit adopts a top gate structure that comprises a first metal layer, a second metal layer, and a third metal layer, the grid lines and a shading layer of the TFT are located in the first metal layer, the cascade lines and a gate of the TFT are located in the second metal layer, and the signal lines and a source and a drain of the TFT are located in the third metal layer.

6. The repair method of the GOA circuit as claimed in claim 5, wherein the top gate structure further comprises a first dielectric layer and a second dielectric layer, the first dielectric layer is disposed between the first metal layer and the second metal layer, and the second dielectric layer is disposed between the second metal layer and the third metal layer.

7. The repair method of the GOA circuit as claimed in claim 4, wherein a thin film transistor (TFT) of the GOA circuit adopts a bottom gate structure that comprises a fourth and a fifth metal layer; the grid lines and a gate of the TFT are located in the fourth metal layer, and the cascade lines, the signal lines, and a source and a drain of the TFT are located in the fifth metal layer.

8. The repair method of the GOA circuit as claimed in claim 7, wherein the bottom gate structure further comprises a third dielectric layer disposed between the fourth metal layer and the fifth metal layer.

9. A gate driver on array (GOA) circuit, comprising:

at least two cascaded GOA units;

connecting lines connected to the cascaded GOA units and configured to realize circuit connection and signal transmission; and grid lines disposed, in a different layer from the connecting lines, to correspond to the connecting lines, wherein, for a short circuit or open circuit malfunction at the connecting lines, the grid lines are configured to repair the connecting lines to repair the GOA circuit by using one or more of three methods of melting and disconnecting a part of the grid lines, melting and disconnecting a part of the connecting lines, or welding together the part of the grid lines and the part of the connecting lines, wherein the connecting lines comprise cascade lines and signal lines, each stage of the GOA units comprises a pull-up unit and a pull-up control unit connected to each other, and the pull-up unit of an N stage GOA unit is connected to the pull-up control unit of an N+M stage GOA unit through the cascade lines, wherein N and M are integers greater than zero, the signal lines are connected to the pull-up unit of the GOA units, and a thin film transistor (TFT) of the GOA circuit adopts a top gate structure that comprises a first metal layer, a second metal layer, and a third metal layer, the grid lines and a shading layer of the TFT are located in the first metal layer, the cascade lines and a gate of the TFT are located in the second metal layer, and the signal lines and a source and a drain of the TFT are located in the third metal layer.

10. The GOA circuit as claimed in claim 9, wherein the top gate structure further comprises a first dielectric layer and a second dielectric layer, the first dielectric layer is disposed between the first metal layer and the second metal layer, and the second dielectric layer is disposed between the second metal layer and the third metal layer.

11. A display panel, comprising a gate driver on array (GOA) circuit, wherein the GOA circuit comprises:

at least two cascaded GOA units;

connecting lines connected to the cascaded GOA units and configured to realize circuit connection and signal transmission; and grid lines disposed, in a different layer from the connecting lines, to correspond to the connecting lines, wherein, for a short circuit or open circuit malfunction at the connecting lines, the grid lines are configured to repair the connecting lines to repair the GOA circuit by using one or more of three methods of melting and disconnecting a part of the grid lines, melting and disconnecting a part of the connecting lines, or welding together the part of the grid lines and the part of the connecting lines, wherein the connecting lines comprise cascade lines and signal lines, each stage of the GOA units comprises a pull-up unit and a pull-up control unit connected to each other, and the pull-up unit of an N stage GOA unit is connected to the pull-up control unit of an N+M stage GOA unit through the cascade lines, wherein N and M are integers greater than zero, the signal lines are connected to the pull-up unit of the GOA units, and a thin film transistor (TFT) of the GOA circuit adopts a top gate structure that comprises a first metal layer, a second metal layer, and a third metal layer, the grid lines and a shading layer of the thin film transistor are located in the first metal layer, the cascade lines and a gate of the thin film transistor are located in the second metal layer, and the signal lines and a source and a drain of the thin film transistor are located in the third metal layer.

12. The display panel as claimed in claim 11, wherein the top gate structure further comprises a first dielectric layer and a second dielectric layer, the first dielectric layer is disposed between the first metal layer and the second metal layer, and the second dielectric layer is disposed between the second metal layer and the third metal layer.

* * * * *